United States Patent
Lee et al.

(10) Patent No.: US 7,581,155 B2
(45) Date of Patent: Aug. 25, 2009

(54) APPARATUS FOR FEC SUPPORTING TRANSMISSION OF VARIABLE-LENGTH FRAMES IN TDMA SYSTEM AND METHOD OF USING THE SAME

(75) Inventors: Hoon Lee, Daejeon (KR); Tae Whan Yoo, Daejeon (KR); Hyeong Ho Lee, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 384 days.

(21) Appl. No.: 11/004,401

(22) Filed: Dec. 3, 2004

(65) Prior Publication Data

US 2005/0149821 A1 Jul. 7, 2005

(30) Foreign Application Priority Data

Dec. 18, 2003 (KR) ............... 10-2003-0093109
May 11, 2004 (KR) ............... 10-2004-0033065

(51) Int. Cl.
*H03M 13/00* (2006.01)
(52) U.S. Cl. .................... 714/779; 714/774
(58) Field of Classification Search ........... 714/774, 714/779
See application file for complete search history.

(56) References Cited

U.S. PATENT DOCUMENTS

| | | | | |
|---|---|---|---|---|
| 4,873,688 A | * | 10/1989 | Maki et al. ............ | 714/784 |
| 5,434,719 A | * | 7/1995 | Miller et al. ........... | 360/53 |
| 5,610,929 A | * | 3/1997 | Yamamoto ............. | 714/785 |
| 5,745,505 A | * | 4/1998 | Yonemitsu et al. ...... | 714/755 |
| 5,768,296 A | | 6/1998 | Langer et al. | |
| 5,856,988 A | * | 1/1999 | Kiriyama ............... | 714/774 |
| 5,978,958 A | * | 11/1999 | Tanaka et al. .......... | 714/804 |
| 6,081,920 A | * | 6/2000 | Morelos-Zaragoza ..... | 714/785 |
| 6,347,389 B1 | | 2/2002 | Boyer | |
| 6,487,692 B1 | | 11/2002 | Morelos-Zaragoza | |
| 6,735,735 B1 | * | 5/2004 | Ohira et al. ............ | 714/776 |
| 6,763,025 B2 | * | 7/2004 | Leatherbury et al. ... | 370/395.64 |
| 6,871,314 B2 | * | 3/2005 | Ohira et al. ............ | 714/776 |
| 6,920,600 B2 | * | 7/2005 | Litwin et al. .......... | 714/784 |
| 7,020,826 B2 | * | 3/2006 | Litwin et al. .......... | 714/784 |

FOREIGN PATENT DOCUMENTS

KR    2001-0023491    3/2001

* cited by examiner

*Primary Examiner*—Joseph D Torres
(74) *Attorney, Agent, or Firm*—Blakely, Sokoloff, Taylor & Zafman (57) ABSTRACT

An apparatus for transmitting a FEC frame is provided. In order to correct an error caused by a transmission medium using FEC in a Reed-Solomon code type, FEC encoding/decoding of a frame is performed. A total transmission delay time is not influenced when FEC is bypassed, a delay caused by a shortened codeword is minimized, and a FEC encoding/decoding delays for frames having different lengths are equalized.

8 Claims, 9 Drawing Sheets

APPARATUS FOR FEC SUPPORTING TRANSMISSION OF VARIABLE-LENGTH FRAMES IN TDMA SYSTEM AND METHOD OF USING THE SAME

BACKGROUND OF THE INVENTION

This application claims the priority of Korean Patent Application Nos. 2003-93109 and 2004-33065, filed on Dec. 18, 2003, and May 11, 2004, respectively, in the Korean Intellectual Property Office, the disclosures of which are incorporated herein in their entirety by reference.

1. Field of the Invention

The present invention relates to an apparatus for transmitting and receiving a Forward Error Correction (FEC) frame in a TDMA system optimized to a transmission rate for variable-length frame transmission that performs a FEC encoding/decoding of a frame having various lengths in a TDMA system in frames, and provides all of frames with the same processing delay time, and a method of using the same.

2. Description of the Related Art

A full duplex TDMA system used to understand an influence of a processing delay time of FEC in a TDMA system can be, for example, a conventional Ethernet-Passive Optical Network (PON) system.

Figure 1:
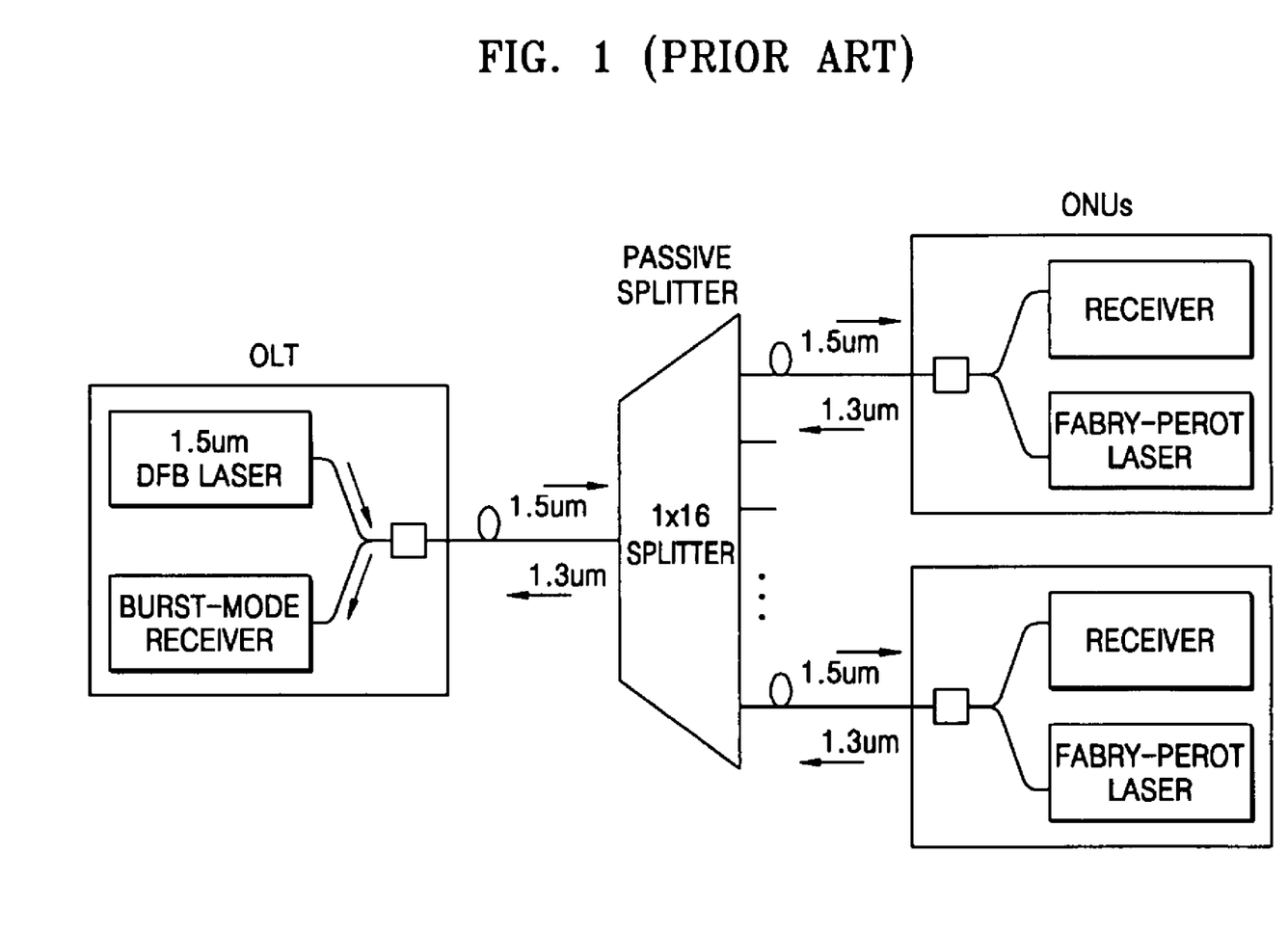
FIG. 1 is a block diagram of an Ethernet-PON system as an example of a conventional TDMA system.

Referring to FIG. 1, an Ethernet-PON system performs the role of point-to-multipoint Ethernet link in order to allow communications between an Optical Link Termination (OLT) and an Optical Network Unit (ONU) and between an ONU and an ONU in a PON distribution network. ONUs are connected the OLT through 1×n splitter. Transmission from the ONU to the OLT is referred to as an upstream transmission, and transmission from the OLT to the ONU is referred to as a downstream transmission. In a PON, an Ethernet frame of a downstream transmission physically has transmission characteristics of broadcast that are received by all of the ONUs. However, an Ethernet frame of an upstream transmission is incapable of being transmitted from the ONU to another ONU.

Due to these PON characteristics, a MultiPoint Control Protocol (MPCP) function that controls a frame transmission time of each ONU is used to prevent collision between frames when a plurality of ONUs transmit Ethernet frames upstream to the OLT. The OLT determines an upstream transmission time available for each of the ONUs and informs the OLT of the upstream transmission times, the ONU transmits Ethernet frames upstream to the OLT during the designated transmission times determined by the OLT. Since the OLT should know if there is an Ethernet frame to be transmitted upstream from the ONU to the OLT in order to determine a transmission time, the ONU notifies the OLT in advance whether there is an Ethernet frame to be transmitted upstream. As such, information for performing upstream TDMA is delivered between the OLT and the ONU. In this regard, a Media Access Control (MAC) layer generates and terminates a MPCP MAC control frame having the information for performing the upstream TDMA.

Each of the ONUs locates at a predetermined distance from the OLT in a PON distribution network. When the OLT assigns an upstream transmission time to the ONU using a TDMA method, it is necessary for the upstream transmission time to be compensated for as much as a Round Trip Time (RTT). Through the compensation, there is no possibility of collision of upstream signals when OLT receives the upstream signals. Every Ethernet frame should have an equal data processing delay time at the OLT and the ONU in order to accurately measure ranging, which is equally applied to FEC.

When using FEC, additional information besides data should be transferred in order to correct an error. The additional information reduces the data transmission rate. Therefore, when a transmission medium state is good, a FEC function can be blocked.

FIG. 1 is a block diagram of an Ethernet-PON system as an example of a conventional TDMA system. Referring to FIG. 1, since distances between the OLT and each of the ONUs are different from each other in the Ethernet-PON system, the links have different transmission characteristics. A predetermined link must employ FEC in order to have link quality required by a system. However, another predetermined link may satisfy a link quality without FEC. In this case, the ONU of a link that does not require FEC blocks a FEC function and prevents a transmission rate reduction caused by additional information transmission for FEC.

In this case, the OLT receives both a FEC encoded frame and a FEC unencoded frame from a plurality of ONUs that share a transmission medium. The OLT FEC encodes a data frame and transmits the encoded data frame to a predetermined ONU, and does not FEC encode a data frame and transmits it to another predetermined ONU. Therefore, an OLT that can perform FEC can optionally perform a FEC function on/off in frames. The simplest process is to bypass the FEC function.

The bypassing of the FEC function during the data transmission in a TDMA system is identical to changing a FEC processing delay time, thereby making it difficult to control medium of a master. Therefore, FEC can be bypassed by performing a matching delay that takes a processing delay time of a FEC function block into consideration.

A Reed-Solomon code, which is a strongest block code against a burst error and widely used in FEC, usually operates in a Galois Field (GF) 256, and is expressed by RS (n, k, t), where n is the length of a Reed-Solomon codeword, k is the length of a message, and t is the number of bytes required to correct an error. A Reed-Solomon code adds a parity r(x) having (n-k) bytes to a message m(x) having k bytes to constitute a codeword c(x) having n bytes as indicated by Equation 1 below. Errors of predetermined t bytes that occur in a codeword c(x) having n bytes can all be corrected.

$$m(x) = M_{k-1}x^{k-1} + m_{k-2}x^{k-2} + \ldots + m_1 x + m_0$$

$$r(x) = R_{g(x)}[x^{2t}m(x)]$$

$$c(x) = x^{n-k}m(x) + r(x) \qquad [\text{Equation 1}]$$

Figure 2:
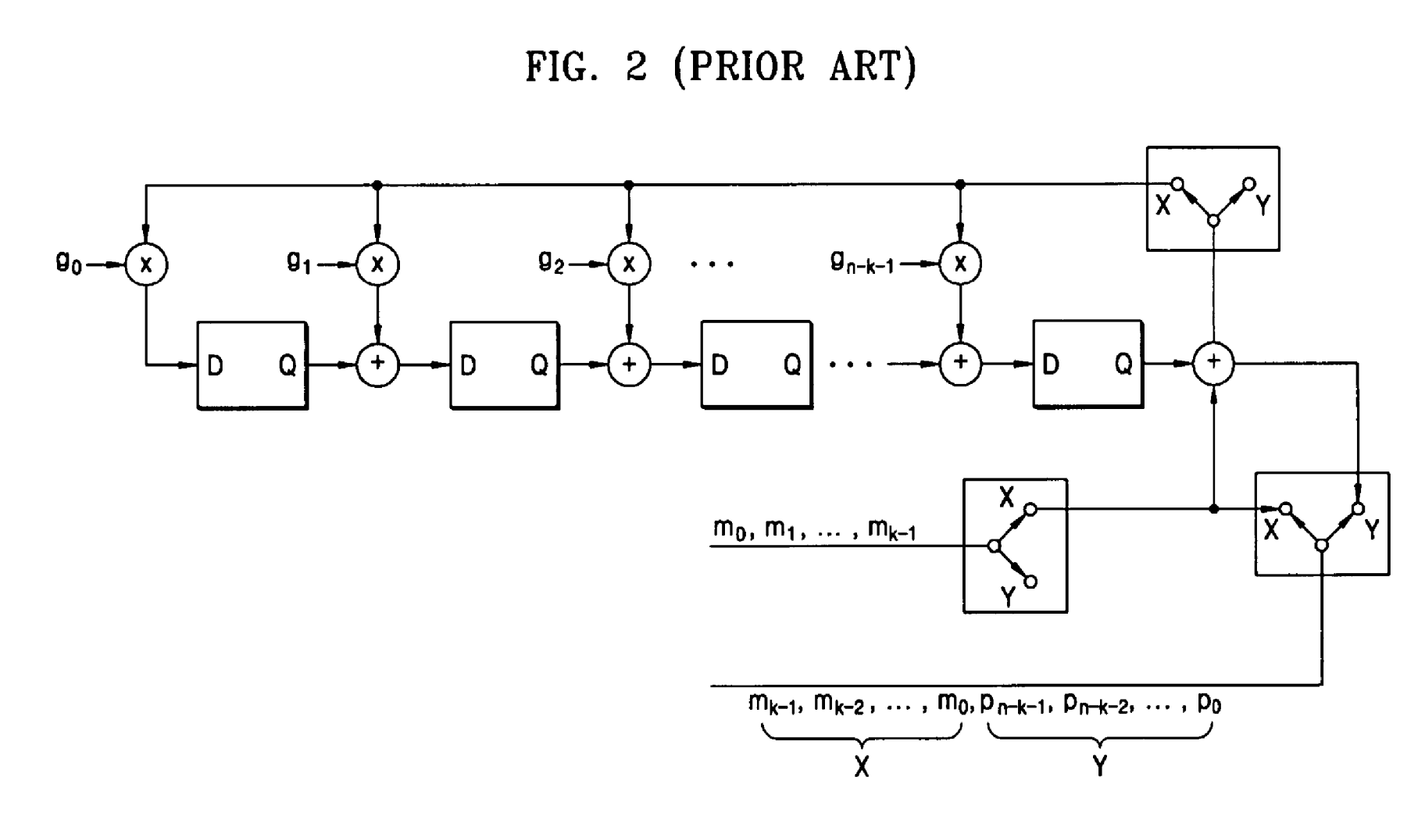
FIG. 2 is a block diagram of a conventional Reed-Solomon encoder.

A Reed-Solomon encoder generates c(x) by adding m(x) to a remainder of m(x) multiplied by $x^{2t}$ divided by a generating polynomial g(x), and has a structure as shown in FIG. 2.

FIG. 2 is a block diagram of a conventional Reed-Solomon encoder. FIG. 2 shows an example of an RS(255, 239, 8) encoder. When a selection signal X is "1", the Reed-Solomon encoder receives an input message, divides the input message by the generating polynomial g(x), and receives a final input message to store r(x) in a register. When a selection signal is Y, stored r(x)s are output sequentially.

Figure 3:
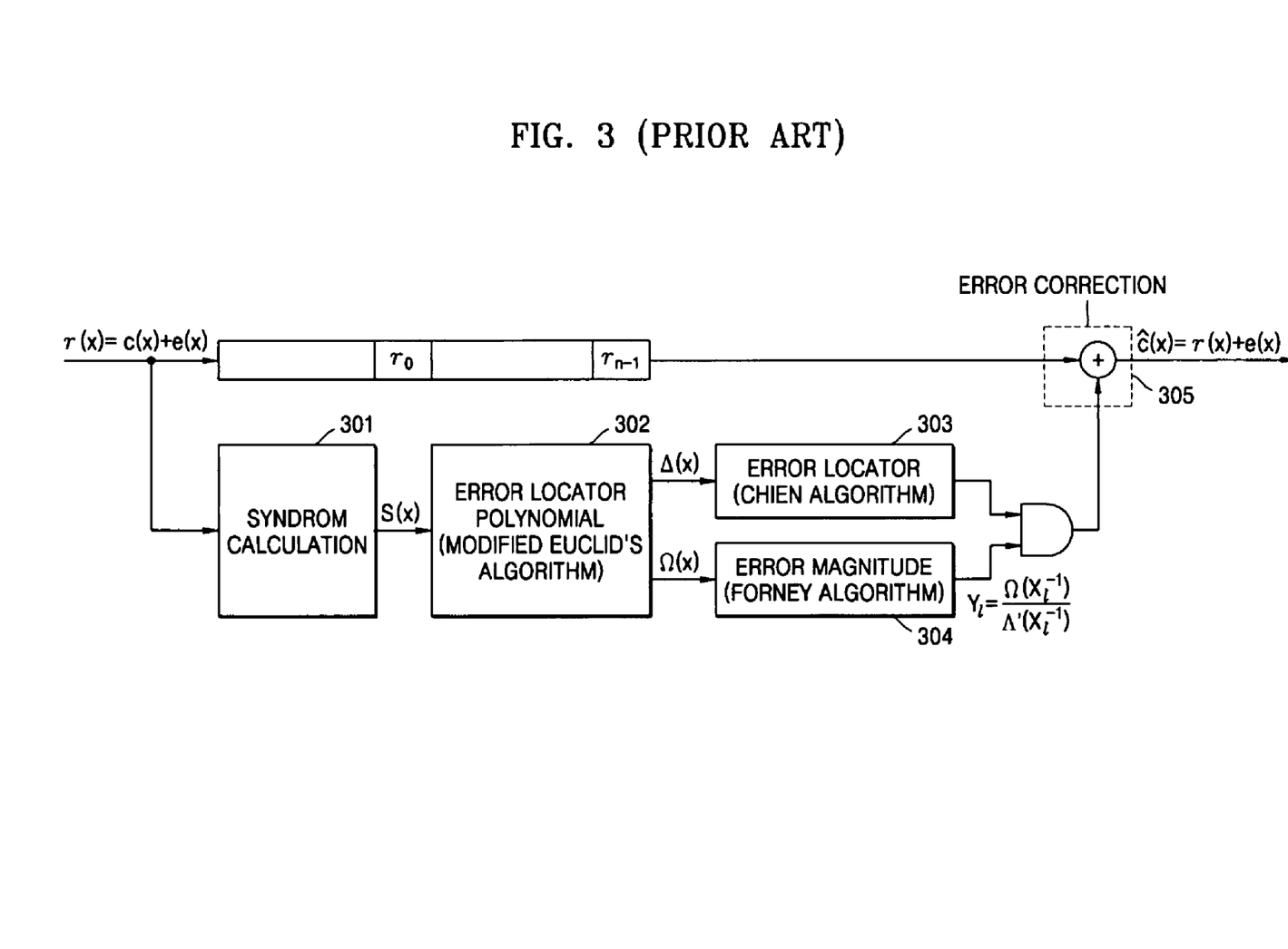
FIG. 3 is a block diagram of a conventional Reed-Solomon decoder.

FIG. 3 is a block diagram of a conventional Reed-Solomon decoder. Referring to FIG. 3, the Reed-Solomon decoder locates the position and size of an error from a received codeword r(x)=c(x)+e(x) and generates an error e(x), and removes the error e(x) from r(x) to restore c(x). To this end, the Reed-Solomon decoder comprises a syndrome calculation block 301, an error location polynomial block 302, an error location detection block 303, an error magnitude detection block 304, and an error correction block 305.

The syndrome calculation block 301 substitutes a root of the generating polynomial g(x) into the received data r(x) to generate a syndrome polynomial S(x) with respect to an error. The error location polynomial block 302 generates an error location polynomial Λ(X) and an error magnitude polynomial Ω(X) from the syndrome polynomial S(x). The error location detection block 303 detects the location of the error from the error location polynomial Λ(X) using a Chien search algorithm. The error magnitude detection block 304 detects the magnitude of the error from the error magnitude polynomial Ω(X) using a Formey algorithm. The detected error magnitude and location are logically multiplied (AND) to be an error value e(x) of the corresponding location. The error correction block 305 subtracts e(x) from r(x), which is delayed by a time required to perform Reed-Solomon decoding and output the error corrected codeword c(x).

The Reed-Solomon encoder outputs an input message directly and theoretically has no delay. However, When the Reed-Solomon encoder processes a shortened code, delay is caused because of a zero-padding.

For example, when the length of a message is (k−1) bytes, the actual message is given by Equation 2 below, and the corresponding zero-padded message is given by Equation 3 below.

$$m(x) = m_{k-1}x^{k-1-l} + m_{k-2}x^{k-2-l} + \ldots + m_1 x + m_0 \quad \text{[Equation 2]}$$

$$m(x) = 0 \cdot x^{k-1} + 0 \cdot x^{k-2} + \ldots + m_{k-1}x^{k-1-l} + m_{k-2}x^{k-2-l} + \ldots + m_1 x + m_0 \quad \text{[Equation 3]}$$

Zero-padding causes an first l byte of a codeword to have a value of 0, which is removed before being output from the Reed-Solomon encoder. This process results in a difference of a blank of l byte between a normal Reed-Solomon codeword and a shortened codeword which are output consecutively. Thus, an output of a normal codeword must be delayed by l byte in order to compensate for the blank of l byte. In the same manner as the Reed-Solomon encoder, the Reed-Solomon decoder removes a padded zero when outputting an error corrected codeword, which also delays a processing time. During the consecutive Ethernet frame transmission, a delay caused by a zero-padding causes overlapping of codewords in adjacent frames. An Inter Frame Gap (IFG) between consecutive frames should be provided in consideration of zero-padding in order to prevent codewords from being overlapped. This increases the length of a frame, causing a reduction in a transmission rate. In an Ethernet frame transmission, a zero-padding reduces a transmission rate by about 35%.

Accordingly, a method that effectively decreases a reduction in a transmission rate caused by zero-padding and equalizes delays of frames having different lengths is necessary.

SUMMARY OF THE INVENTION

The present invention provides an apparatus for performing a FEC encoding/decoding of a frame, in which a total transmission delay time is constant when FEC is bypassed, a zero-padding delay time is removed by virtually zero-padding necessary for shortened codewords, and a FEC encoding/decoding delay time is equal for frames having different lengths in order to correct an error caused by a transmission medium using a Reed-Solomon code in a full duplex TDMA system for transmitting frames having different lengths; and a method of using the same.

According to an aspect of the present invention, there is provided a Forward Error Correction (FEC) frame used for variable-length frame transmission in a TDMA system, the FEC frame structure comprising: a frame start unit indicating the beginning of a FEC frame; a message unit including a message composed of Ethernet MAC data or variable-length frame data; and an end unit including an information indicating the end of the message and a result of processing FEC.

According to another aspect of the present invention, there is provided an apparatus for transmitting a FEC frame for variable-length frame transmission in a TDMA system, the apparatus comprising: a selector determining whether to perform FEC encoding on data to be transmitted; a Reed-Solomon encoding assembler receiving the data on which FEC encoding is to be performed as determined by the selector, and dividing the data into k-byte message blocks (k is a positive integer) for output; a Reed-Solomon encoder receiving the message blocks and performing Reed-Solomon encoding on the message blocks; and an output controller receiving a parity generated by the Reed-Solomon encoding, and outputting the message block and the parity sequentially or outputting the data on which FEC encoding is not to be performed as determined by the selector.

According to still another aspect of the present invention, there is provided a n apparatus for receiving a FEC frame for variable-length frame transmission in a TDMA system, the apparatus comprising: a first receiver determining whether a received frame is a FEC encoded frame; a Reed-Solomon decoder receiving a FEC encoded frame from the first receiver, and Reed-Solomon decoding with the FEC encoded frame in same processing time regardless of the lengh of the FEC encoded frame; a matching delay receiving an input FEC unencoded frame from the first receiver, and delaying the FEC unencoded frame by the time required to decode a FEC encoded frame, or delaying a FEC frame identifier by the time required to decode a FEC encoded frame; and a frame recombiner adding a Reed-Solomon decoded codeword to the FEC frame identifier output from the matching delay as an original FEC frame.

According to yet another aspect of the present invention, there is provided a method of transmitting a FEC frame for variable-length frame transmission in a TDMA system, the method comprising: determining whether to perform FEC encoding on a frame to be transmitted based on a predetermined identifier of the frame; dividing data of the frame into k-byte message blocks (k is a positive integer), and Reed-Solomon encoding the message blocks when it is that the FEC encoding is to be performed; transmitting a frame sequentially combining the message block and a parity generated by Reed-Solomon encoding the message blocks, or a FEC unencoded frame according to the determination of whether to perform the FEC encoding.

According to further aspect of the present invention, there is provided a method of receiving a FEC frame structure for variable-length frame transmission in a TDMA system, the method comprising: determining whether a received frame is a FEC encoded frame; when the frame is determined to be a FEC encoded frame, Reed-Solomon decoding the FEC encoded frame with a fixed processing time regardless of its length; delaying the frame by the time required to decode a FEC encoded frame when the frame is determined to be a FEC unencoded frame, or delaying a FEC frame identifier by the time required to perform the Reed-Solomon decoding; and adding a Reed-Solomon decoded codeword and the delayed FEC frame identifier to form an original FEC frame.

In order to process a virtual zero-padding necessary for a shortened codeword, and equalize a processing delay time with respect to frames having different lengths, a Reed-Solomon encoder outputs parity in parallel in one clock, a Reed- Solomon decoder pipelines an error location polynomial and an error magnitude polynomial which are output values of an error location polynomial block, and transfers them to an error location detection block and an error magnitude detection block in which initial values of an error location detection block and an error magnitude detection block are input from a look-up table according to the length of a frame. Therefore, although a shortened codeword processing is not actually delayed due to a zero-padding, a virtual zero-padding results in the same accurate error correction as in an actual zero-padding. A Reed-Solomon encoding/decoding delay is managed in the same manner regardless of the length of a frame.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

The present invention will now be described more fully with reference to the accompanying drawings.

Figure 4:
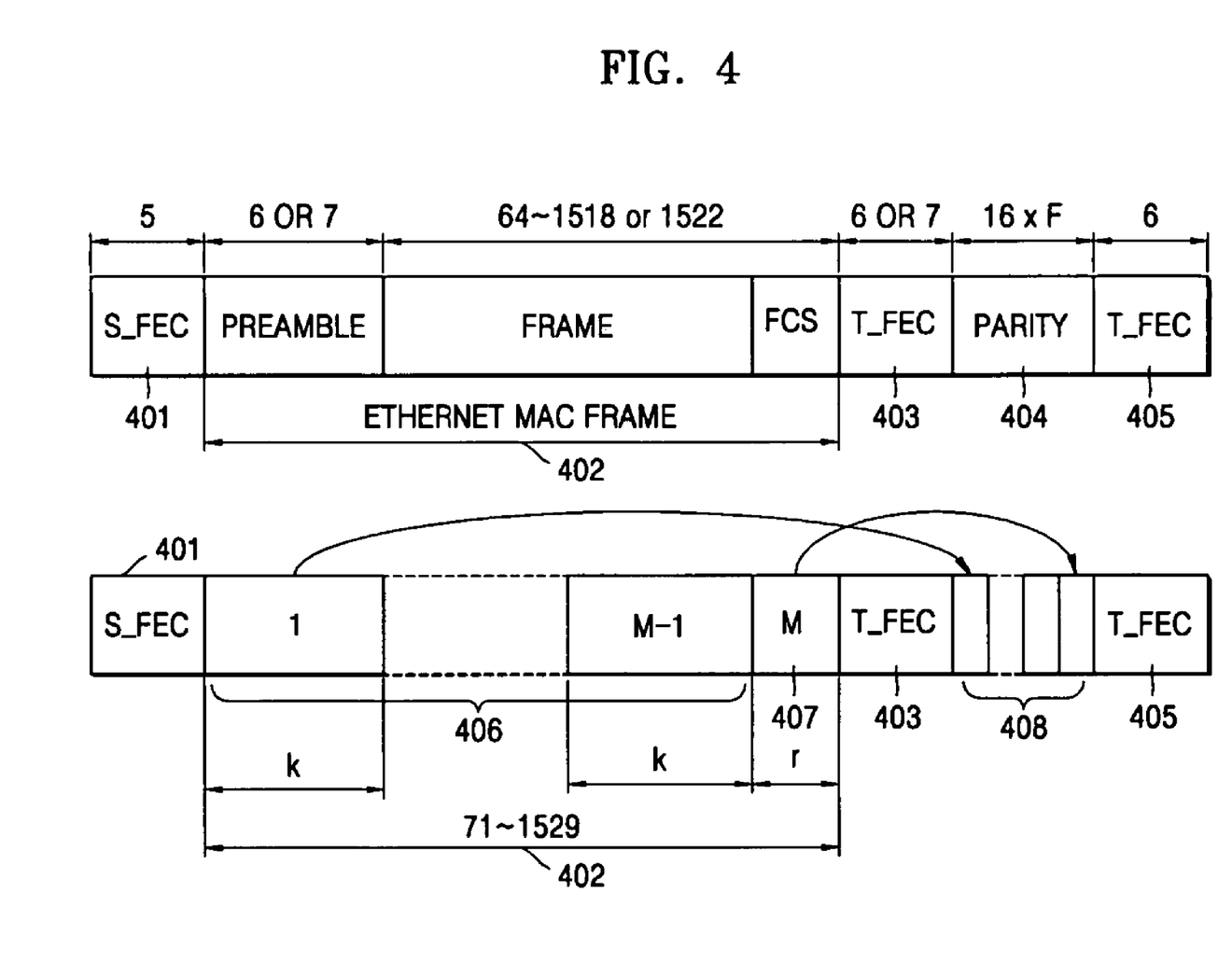
FIG. 4 illustrates the structure of a variable-length data frame according to an embodiment of the present invention.

FIG. 4 illustrates the structure of a variable-length data frame according to an embodiment of the present invention. Referring to FIG. 4, a FEC frame will now be described. The FEC frame includes an Ethernet frame having a maximum length of 1522 bytes or an optional variable-length frame 402, S_FEC 401 having 5 bytes, an identifier indicating the beginning of the FEC frame, as the first five bytes of the FEC frame. The FEC frame further includes T_FEC 403, an identifier indicating the end of a message frame next to the last byte of the FEC frame. A space 404 for parity including additional information for FEC is located after the addition of T_FEC 403, and T_FEC 405, an identifier indicating the end of the FEC frame is next to the space 404 for parity.

A frame for being bypassed without FEC encoding/decoding does not have the space 404 for parity and the T_FEC 405, an identifier indicating the end of the FEC frame, and has a simple configuration of S_FEC 401 and T_FEC 403, which is discriminated from the FEC frame.

A FEC frame has a longer identifier than a non-FEC frame in order to exactly discriminate between the beginning and the end of a frame in a transmission medium having numerous errors.

According to an embodiment of the present invention, a Reed-Solomon code which is strong against burst error is used for a FEC encoding/decoding with respect to a variable-length frame, and supports a codeword with a maximum of 255 bytes due to how the Reed-Solomon code is used in the GF 256. As described above, a Reed-Solomon code is used to generate a codeword by adding a message and parity. When employing RS (n, k, t), a single Reed-Solomon codeword is configured as a message having k bytes and a parity having (n-k) bytes. Therefore, the length of a transmission frame should not exceed the length k of a message. As shown in FIG. 4, when a message length exceeds k bytes, a transmission frame is divided into message blocks 406 each having k bytes for Reed-Solomon code processing.

Referring to FIG. 4, a single transmission frame is divided into m of message blocks 406, and an $m^{th}$ message block 407 has a length of r (0<r<k) bytes to configure a shortened codeword. (n-k) bytes of parity are sequentially stored in a parity storing space 408 as a result of Reed-Solomon encoding each of the message blocks. Reed-Solomon decoding involves the reverse process. To be more specific, when a FEC frame is received by the Reed-Solomon decoder, a message block of the received FEC frame is added to a parity corresponding to the message block to reconfigure a Reed-Solomon codeword in order to perform a Reed-Solomon decoding. This will be described in detail later.

A method of transmitting a FEC frame and an apparatus adapting the same will now be described. FEC according to an embodiment of the present invention uses a Reed-Solomon code, and, accordingly, a FEC encoder uses a Reed-Solomon encoder. As shown in FIG. 2, a conventional Reed-Solomon encoder generates a codeword c(x) by adding a message m(x) to a remainder of the message m(x) multiplied by $x^{2t}$ and divided by a generating polynomial g(x). A conventional Reed-Solomon encoder cannot process a message having a variable-length suitable for a FEC frame according to an embodiment of the present invention.

Figure 5:
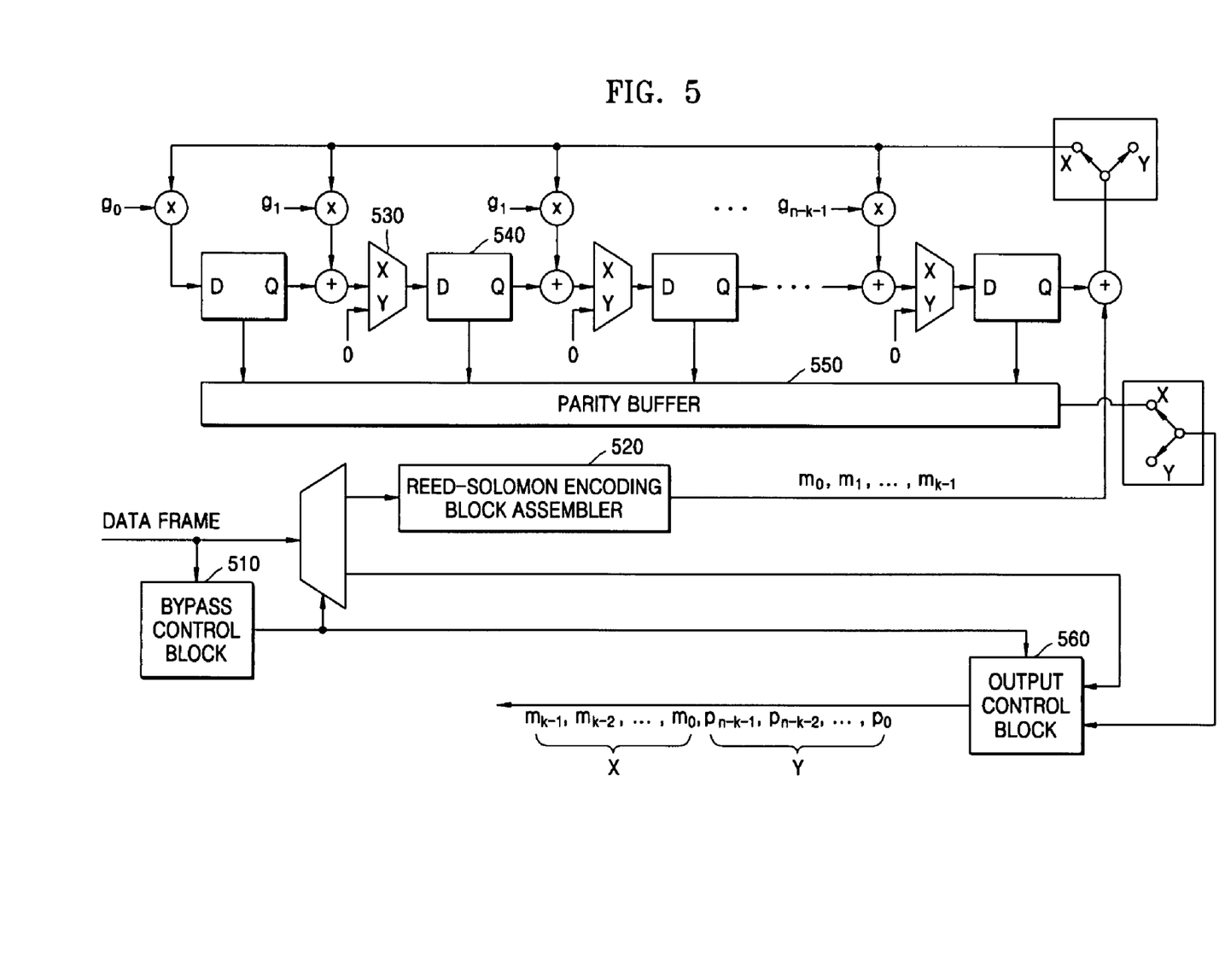
FIG. 5 is a block diagram illustrating a Reed-Solomon encoder according to an embodiment of the present invention.
Figure 7:
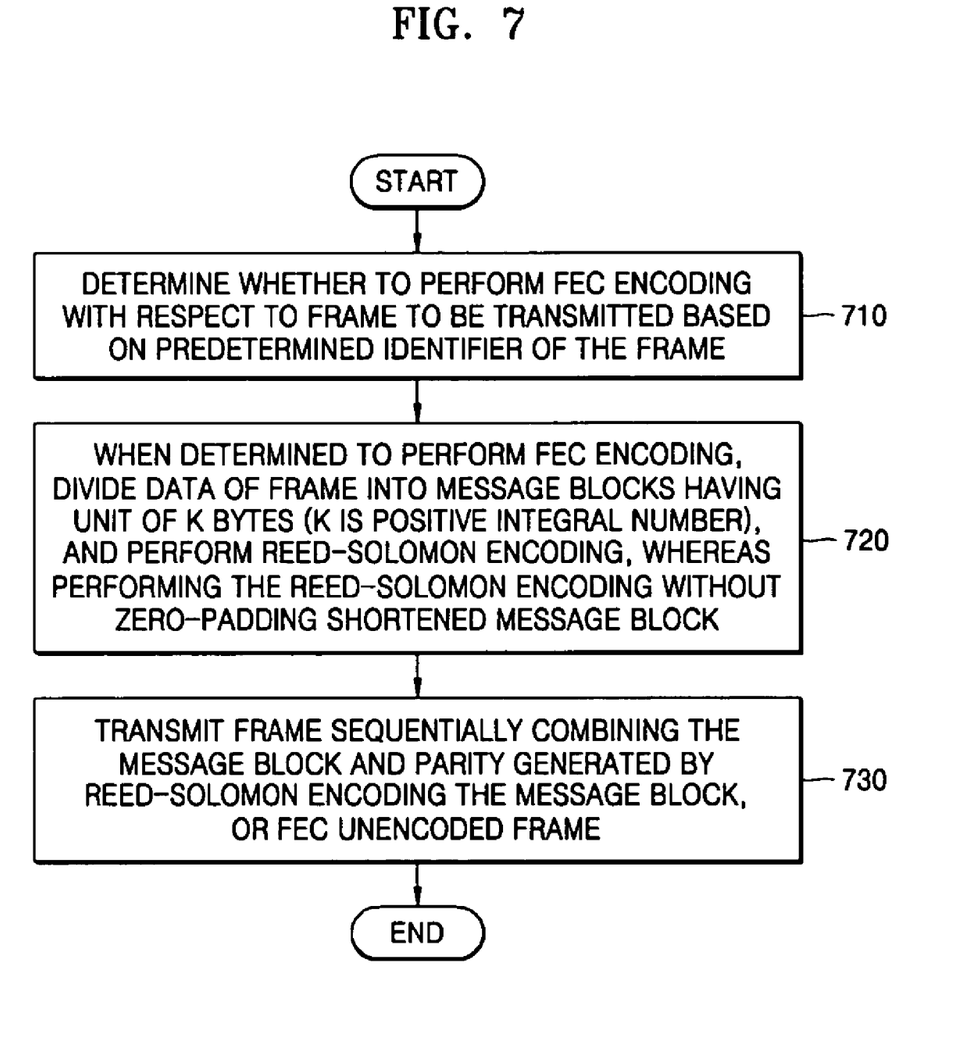
FIG. 7 is a flow chart describing a method of transmitting a FEC frame according to an embodiment of the present invention.

FIG. 5 is a block diagram illustrating a Reed-Solomon encoder according to an embodiment of the present invention. FIG. 7 is a flow chart describing a method of transmitting a FEC frame according to an embodiment of the present invention. An apparatus for transmitting a FEC frame according to an embodiment of the present invention includes a Reed-Solomon encoder with an improved structure as shown in FIG. 5. An initial input data frame acknowledges S_FEC, an identifier indicating the beginning of a FEC frame or S_FEC a non-FEC frame identifier, in a bypass control block 510, and determines whether to FEC encode a present input data frame. When the input data frame is not to be FEC encoded, it is directly output in Operation 710. When a present input data frame is to be FEC encoded, it is input to a Reed-Solomon encoding block assembler 520 to be combined with a message block having k bytes. The message is supplied to a division circuit of a Reed-Solomon encoder to generate parity. After an input $m_0$, a register value of a division circuit becomes a parity value. An input $m_0$ to an input $m_k$ in a next clock results in m input message blocks. Simultaneously with an input $m_k$, MUX 530 of a register input end selects 0 to reset a register 540, and a register value is stored in a parity buffer 550. Since the number of MUXes and the number of registers correspond to the number of divided message blocks, and perform the same function, their reference numerals are united as 530 in FIG. 5.

When Reed-Solomon encoding for the m message blocks is completed, the Reed-Solomon encoder outputs S_FEC from the entire FEC frame and m message blocks, and m parities having (n-k) bytes generated by FEC encoding the m message blocks are stored in the parity buffer 550 in Operation 720. An output control block 560 outputs T_FEC 403 after the $m^{th}$ message block is output, and reads and outputs parities from the parity buffer 550 and then outputs T_FEC 405, thereby FEC encoding of a shortened codeword along with normal codewords each having a length of n bytes.

In a shortened codeword, a message is configured as Equation 4 below and has 0 as a value of an initial 1 byte. A message has 0 as a value of an initial 1 byte of a shortened code because every register value is maintained same as a reset state although this value is input in a Reed-Solomon encoder.

$$m(x)=0 \cdot x^{k-1}+0 \cdot x^{k-2}+ \ldots +m_{k-1}x^{k-1-l}+ \ldots +m_1 x+m_0. \quad \text{[Equation 4]}$$

A Reed-Solomon encoder has an effect as if a zero-padding is performed for a shortened code in Operation 730.

Figure 6:
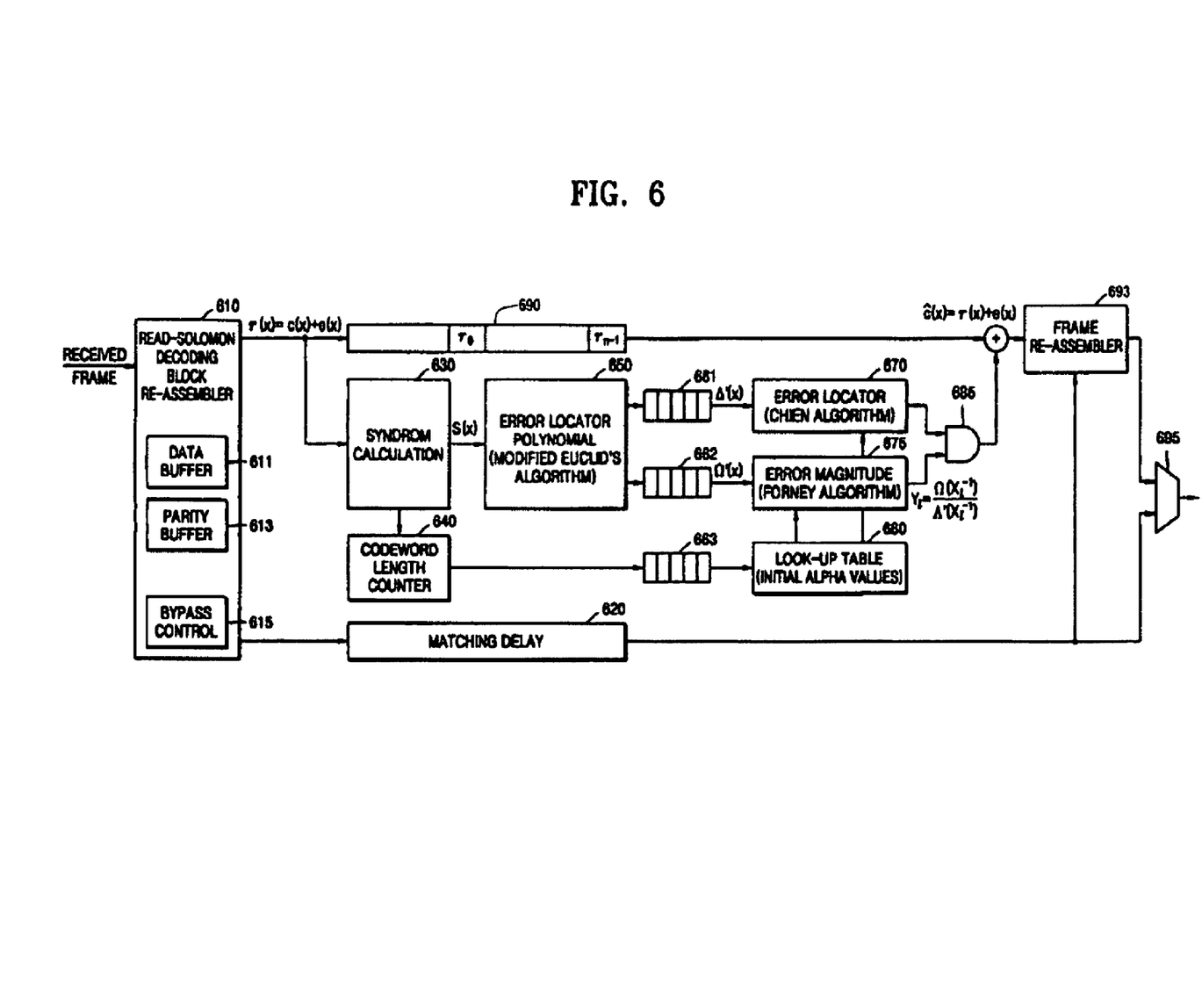
FIG. 6 is a block diagram illustrating a Reed-Solomon decoder according to an embodiment of the present invention.
Figure 8:
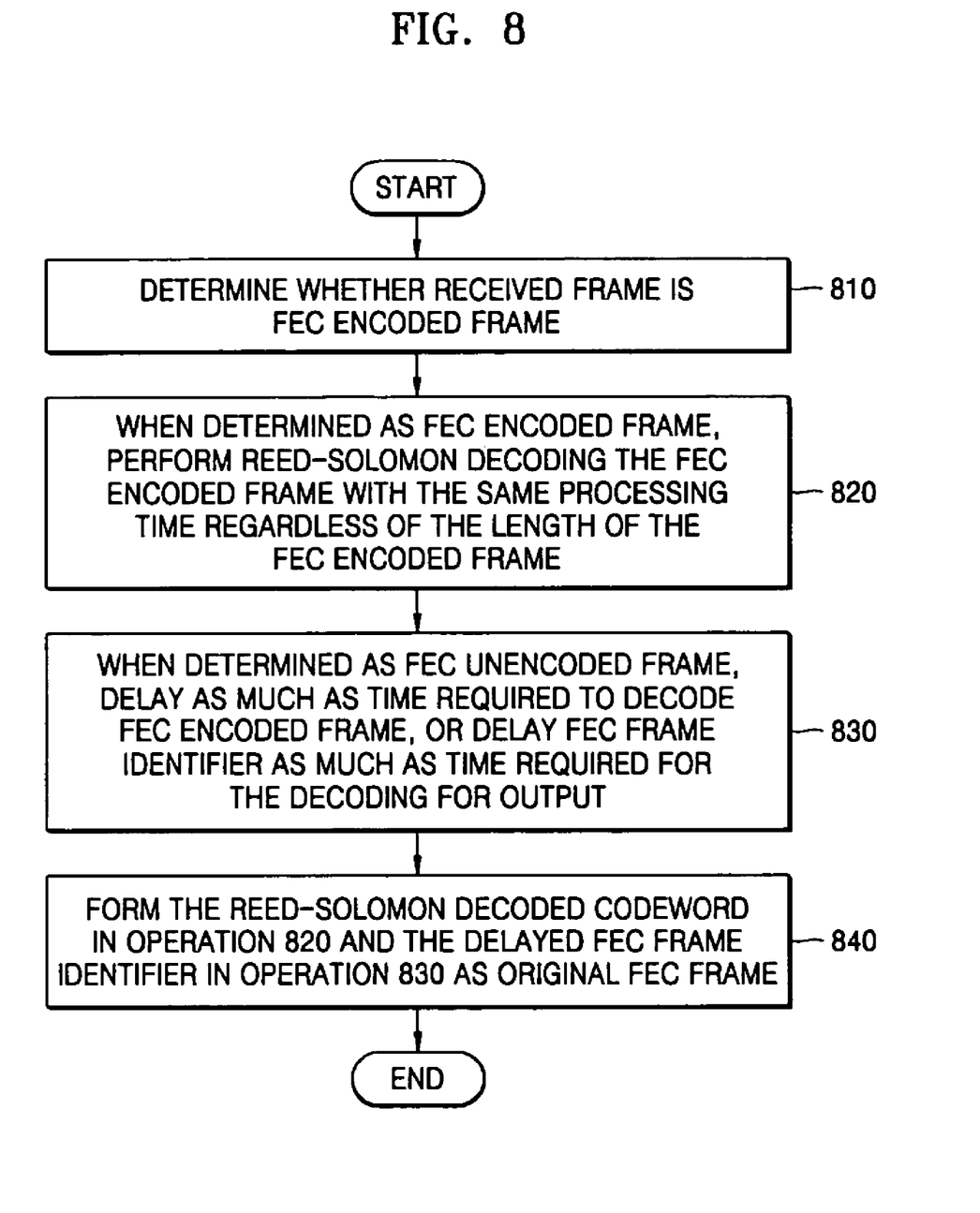
FIG. 8 is a flow chart describing a method of receiving a FEC frame according to an embodiment of the present invention.

FIG. 6 is a block diagram illustrating a Reed-Solomon decoder according to an embodiment of the present invention. FIG. 8 is a flow chart describing a method of receiving a FEC frame according to an embodiment of the present invention. An apparatus and method for receiving a FEC frame will now be described. A FEC decoder also uses a Reed-Solomon decoder that has an improved structure, as shown in FIG. 6. A received frame is input to a Reed-Solomon decoding block re-assembler 610, which locates S_FEC or a simple identifier of S_FEC to determine whether the received frame is FEC encoded. When the received frame is not FEC encoded, it is output through a matching delay 620 in Operation 810.

The matching delay 620 delays the received frame for the time required to decode a FEC encoded frame with the Reed-Solomon decoder. A FEC encoded frame immediately before a FEC unencoded frame can be output later than or simultaneously with the FEC unencoded frame due to a processing delay that occurs in the decoding. That is prevented by the matching delay 620 in Operation 830.

The Reed-Solomon decoding block re-assembler 610, which is a frame buffer, receives an input FEC frame, divides the FEC frame into m message blocks and m parities, and stores the message blocks in a data buffer 611 and the m parities in a parity buffer 613. The data buffer 611 and the parity buffer 613, which are elastic buffers, store input frame data sequentially, and output all of the input frame data with the same delay. A FEC frame identifier not included in a message or a parity as determined by bypass control 615 is not stored in a buffer but is transmitted to a frame re-assembler 693 through the matching delay 620.

The frame re-assembler 693 reconfigures an original FEC frame using a Reed-Solomon decoded codeword and the identifier received from the matching delay 620. The message blocks and m parities stored in the data buffer 611 and the parity buffer 613 are input to the Reed-Solomon decoder sequentially. In detail, the first message block, the first parity, the second message block, the second parity, . . . , the $m^{th}$ message, the $m^{th}$ parity are output sequentially, which results in m input Reed-Solomon codewords.

A Reed-Solomon decoder calculates a syndrome using input codewords. A syndrome is calculated by substituting an input codeword having n bytes for all the roots of a generating polynomial and summing the results. An input of a last codeword results in an output of a syndrome. While a syndrome calculation circuit 630 calculates a syndrome, a codeword length counter 640 measures the length of input codewords. This is in order to accurately measure the length of a shortened codeword. An input syndrome S(x) calculated by an error location polynomial block 650 is used to generate an error location polynomial $\Lambda(x)$ and an error magnitude polynomial $\Omega(x)$.

The error location polynomial block 650 uses a recursive modified Euclid algorithm in order to have the same delay time, which requires a 16 bytes clock regardless of the length of a codeword. The error location polynomial $\Lambda(x)$ and the error magnitude polynomial $\Omega(x)$ are outputs from the error location polynomial block 650 to an error location block 670 and an error magnitude block 675 to determine the error location and magnitude of an error.

Figure 9:
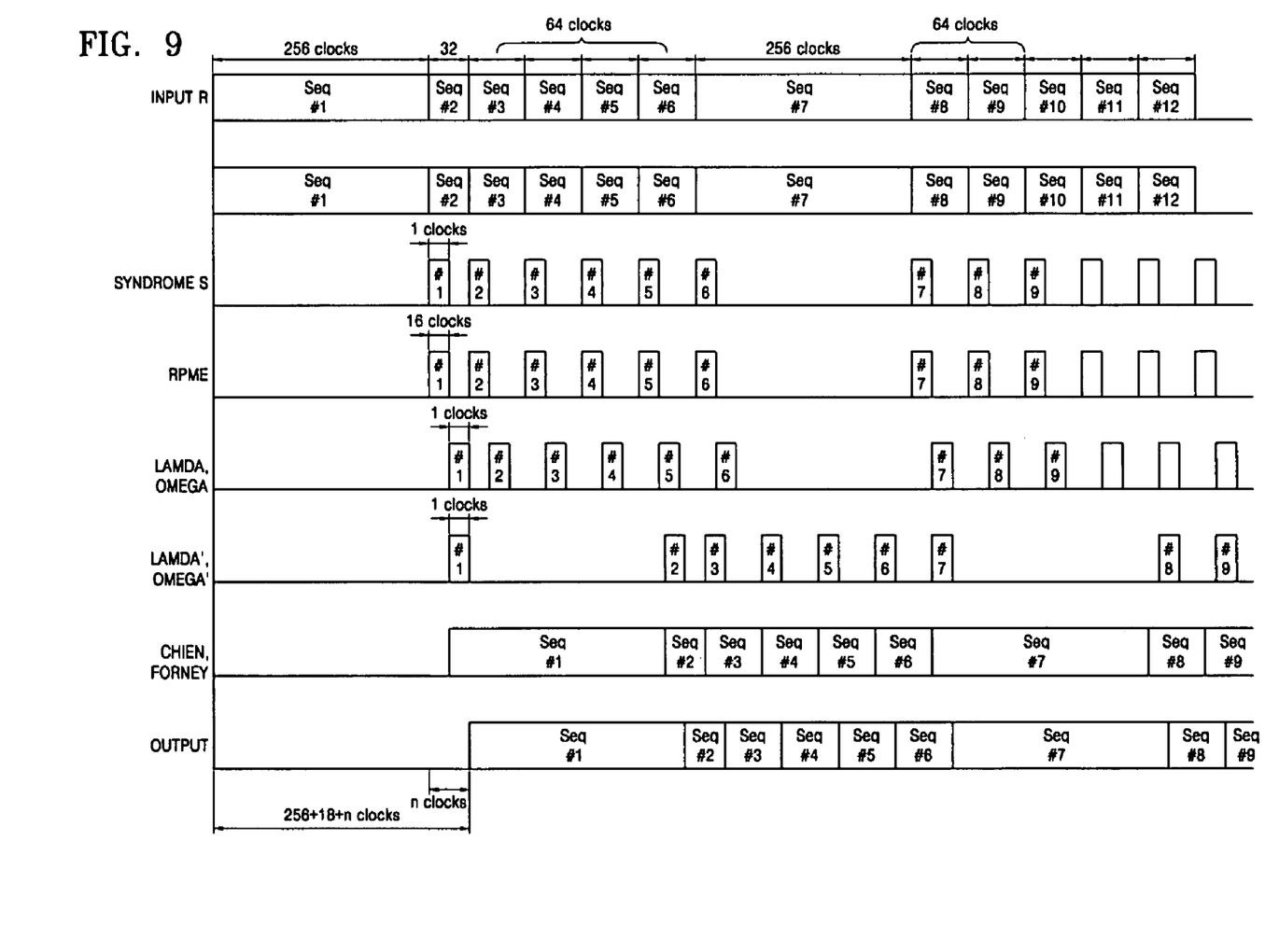
FIG. 9 is a timing diagram illustrating a Reed-Solomon decoder according to an embodiment of the present invention.

As in the Reed-Solomon decoding timing shown in FIG. 9, when an input codeword comprises a long codeword and multiple consecutive short codewords, it has the same delay time until an error location polynomial $\Lambda(x)$ and an error magnitude polynomial $\Omega(x)$. However, an error location detection block using the Chien search algorithm and an error magnitude detection block using the Formey algorithm require a processing time proportional to the length of a codeword used to generate the corresponding $\Lambda(x)$ and $\Omega(x)$ using output $\Lambda(x)$ and $\Omega(x)$. Therefore, a direct input of $\Lambda(x)$ and $\Omega(x)$ causes loss of $\Lambda(x)$ and $\Omega(x)$ generated by a codeword having a short length. This problem is caused by simultaneously supporting frames having different lengths, and occurs since an encoder does not perform zero-pad shortened codewords.

In order to solve this problem, in an embodiment of the present invention, buffers 661 and 662 store $\Lambda(x)$ and $\Omega(x)$, respectively, an error location detection block 670 and an error magnitude detection block 675 complete to process one codeword, and output $\Lambda(x)$ and $\Omega(x)$ of a next codeword. The buffers 661, 662, and 663 buffer $\Lambda(x)$, $\Omega(x)$, and the length of a codeword, respectively. This buffering allows delay time of $\Lambda(x)$ and $\Omega(x)$ to be changed to $\Lambda'(x)$ and $\Omega'(x)$. As shown in FIG. 6, $\Lambda(x)$ and $\Omega(x)$ provide codewords having different lengths with the same delay time.

Buffering of $\Lambda(x)$, $\Omega(x)$, and the length of a codeword makes it possible for a Reed-Solomon decoder to decode frames having a variable-length with the same delay time without zero-padding in order to process a shortened codeword.

However, in spite of the constant delay time, a problem still remains. The Chien search algorithm used in the error location detection block 670 makes it possible for the inverses of roots of an error location polynomial to contain information in an error location. Accordingly, when a result obtained by substituting the values $\alpha^{-(n-1)}, \alpha^{-(n-2)}, \ldots, \alpha^{-1}, \alpha^0$ into an error location polynomial sequentially is 0, the corresponding location is an error location.

A root substitution circuit is repeatedly used n times to perform the Chien search algorithm in order to reduce hardware. When the length of an input codeword is n(=255), an initial value is $\alpha^0$, whereas input codewords having different lengths have one of $\alpha^{-(n-1)}, \alpha^{-(n-2)}, \ldots, \alpha^{-1}, \alpha^0$ as an initial value.

According to an embodiment of the present invention, 255 initial values are configured as a ROM look-up table 680 to make the length of a codeword examined in the codeword length counter 640 an address that selects a value of a look-up table such that an initial value is based on the length of a codeword. Since the error magnitude detection block 675 using the Formey algorithm equally uses a selected initial value, one look-up table is configured.

When the location and the magnitude of an error are determined, an error value is obtained using an AND gate 685. An error value e(x) is subtracted from a codeword output from the buffer 690, which delays the codeword by the time required for Reed-Solomon decoder to perform decoding, resulting in an error corrected codeword in Operation 820. After the error corrected codeword is input to the frame re-assembler block 693 to be reconfigured into a FEC frame, the parity storing space 408 is zero-padded in Operation 840.

According to an embodiment of the present invention, a frame having an optional length is provided with the same delay time, and a reduction in a transmission rate cause by a shortened code is minimized. A transmission frame having various lengths is divided into block combinations having different lengths, of which is each Reed-Solomon encoded/decoded. When the last divided block is shorter than required, it is virtually zero-padded. Codewords are overlapped when processing blocks having different lengths. Codeword overlapping is resolved by a pipelining. Initial values output from an error location detection block and an error magnitude detection block are loaded from a look-up table. Therefore, a frame having an optional length can be provided with a fixed delay time, and a reduction of a transmission rate caused by a shortened code can be minimized.

It is possible for the present invention to be realized on a computer-readable recording medium as a computer-readable code. Computer-readable recording mediums include every kind of recording device that stores computer system-readable data. ROMs, RAMs, CD-ROMs, magnetic tapes, floppy discs, optical data storage, etc. are used as a computer-readable recording medium. Computer-readable recording mediums can also be realized in the form of a carrier wave (e.g., transmission through Internet). A computer-readable recording medium is dispersed in a network-connecting computer system, resulting in being stored and executed as a computer-readable code by a dispersion method.

As described above, in order to correct an error caused by a transmission medium using FEC on a Reed-Solomon code, FEC encoding/decoding of a frame is FEC encoded/decoded, a total transmission delay time is not changed when FEC is bypassed, a delay time caused by a shortened codeword is minimized, and a FEC encoding/decoding delay time is constant for frames having different lengths.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for receiving a FEC frame for variable-length frame transmission in a TDMA system, the apparatus comprising:
    a first receiver determining whether a received frame is a FEC encoded frame, wherein when the received frame is a FEC encoded frame having a predetermined number of message blocks and parities equal in number to the message blocks sequentially, the first receiver divides the FEC encoded frame into the message blocks and parities after removing a FEC frame identifier from the FEC encoded frame, the first receiver includes a data buffer and a parity buffer respectively storing the message blocks and the parities;
    a Reed-Solomon decoder receiving the FEC encoded frame from the first receiver, and Reed-Solomon decoding the FEC encoded frame in a same processing time regardless of the length of the FEC encoded frame, wherein the Reed-Solomon decoder calculates an error magnitude polynomial to determine an error value of the FEC encoded frame, the Reed-Solomon decoder buffers an error magnitude polynomial in a first buffer and an error location polynomial in a second buffer to determine an error value of the FEC encoded frame, the Reed-Solomon decoder further comprising:
        a syndrome calculator calculating a syndrome for each of the codewords,
        a codeword counter counting the length of the codewords,
        the error location polynomial generator receiving the syndrome calculated by the syndrome calculator, and generating an error location polynomial and the error magnitude polynomial using a recursive modified Euclid algorithm,
        an error location detection unit searching for a location of the error of the codeword using the Chien algorithm based on initial values of the lengths of codewords,
        an error magnitude detection unit searching for the magnitude of the error of the codeword using the Forney algorithm based on the initial values, and
        a memory comprising a first queue storing the error location polynomial output from the error location polynomial generator, and a second queue storing the error magnitude polynomial output from the error location polynomial generator, and storing the error location polynomial and the error magnitude polynomial until the error location detection unit and the error magnitude detection unit complete to process a previous codeword for output;
    a matching delay receiving an input FEC unencoded frame from the first receiver, and delaying the FEC unencoded frame by the time required to decode a FEC encoded frame, or delaying a FEC frame identifier by the time required to decode a FEC encoded frame; and
    a frame recombiner adding a Reed-Solomon decoded codeword to the FEC frame identifier in response to the output from the matching delay to form an original FEC frame.

2. The apparatus of claim 1, wherein the data buffer and the parity buffer are elastic buffers that provide each of the received frames with the same delay time.

3. The apparatus of claim 1, wherein the Reed-Solomon decoder further comprises:
    a look-up table storing the initial values each in the error location detection unit and the error magnitude detection unit, and outputting the initial values in the codeword counter using them as addresses for outputting to the error location detection unit and the error magnitude detection unit.

4. The apparatus of claim 3, wherein the memory further comprises a third queue queuing the codeword.

5. The apparatus of claim 1, further comprising:
    a buffer that delays the received frame by a time required to perform the Reed-Solomon decoding, resulting in an error corrected frame; and
    wherein the frame recombiner zero-pads a position in the error corrected frame corresponding to a parity storing space.

6. A method of receiving a FEC frame structure for variable-length frame transmission in a TDMA system, the method comprising:
    determining whether a received frame is a FEC encoded frame;
    when the received frame is determined to be a FEC encoded frame having a predetermined number of message blocks and parities equal in number to the message blocks sequentially, removing a FEC frame identifier from the FEC encoded frame and dividing the FEC encoded frame into the message blocks and parities;
    Reed-Solomon decoding the FEC encoded frame with a fixed processing time regardless of its length, wherein the Reed-Solomon decoding comprises buffering an error magnitude polynomial and an error location polynomial to determine an error value of the FEC encoded frame, wherein the Reed-Solomon decoding comprises:

buffering the divided message blocks and parities for the same time for every frame, calculating a syndrome of codewords, counting the length of the codewords, generating an error location polynomial and the error magnitude polynomial using a recursive modified Euclid algorithm on the syndrome, and queuing the error location polynomial and the error magnitude polynomial until generating the error location polynomial and the error magnitude polynomial with respect to a previous codeword, determining a location of an error of the codeword using the Chien algorithm based on initial values selected from a predetermined look-up table according to the length of the codeword; and determining a magnitude of the error of the codeword using the Forney algorithm based on the initial values;

delaying the received frame by the time required to decode a FEC encoded frame when the received frame is determined to be a FEC unencoded frame, or delaying a FEC frame identifier by the time required to perform the Reed-Solomon decoding; and adding a Reed-Solomon decoded codeword and the delayed FEC frame identifier in response to delaying the FEC frame identifier to form an original FEC frame.

7. The method of claim 6, wherein the determining location of the error of the codeword further comprises:

configuring the look-up table storing the initial values each in order for the error location detection and the error magnitude detection, and using the length of the codeword as an address in order to generate the initial values.

8. The method of claim 6, wherein the delaying the FEC frame identifier comprises:

zero-padding a position in the frame corresponding to a parity storing space.

* * * * *